United States Patent
Ye et al.

(10) Patent No.: US 12,368,110 B2
(45) Date of Patent: Jul. 22, 2025

(54) WAFER ASSEMBLY HAVING ALIGNMENT MARKS, METHOD FOR FORMING SAME, AND WAFER ALIGNMENT METHOD

(71) Applicant: WUHAN XINXIN SEMICONDUCTOR MANUFACTURING CO., LTD., Hubei (CN)

(72) Inventors: Guoliang Ye, Hubei (CN); Xing Hu, Hubei (CN); Hongsheng Yi, Hubei (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 422 days.

(21) Appl. No.: 18/017,986

(22) PCT Filed: Sep. 28, 2020

(86) PCT No.: PCT/CN2020/118560
§ 371 (c)(1),
(2) Date: Jan. 25, 2023

(87) PCT Pub. No.: WO2022/032825
PCT Pub. Date: Feb. 17, 2022

(65) Prior Publication Data
US 2023/0290732 A1    Sep. 14, 2023

(30) Foreign Application Priority Data
Aug. 13, 2020   (CN) .......................... 202010814889.2

(51) Int. Cl.
*H01L 23/544*    (2006.01)

(52) U.S. Cl.
CPC .. *H01L 23/544* (2013.01); *H01L 2223/54426* (2013.01)

(58) Field of Classification Search
None
See application file for complete search history.

(56) References Cited

U.S. PATENT DOCUMENTS

2011/0117701 A1* 5/2011 Patti ...................... H01L 23/544
257/E21.499
2013/0099291 A1* 4/2013 Shimotsusa ......... H10F 39/8037
438/57

(Continued)

FOREIGN PATENT DOCUMENTS

CN   108206142 A   6/2018
CN   109411449 A   3/2019

(Continued)

*Primary Examiner* — Khaja Ahmad
(74) *Attorney, Agent, or Firm* — Muncy, Geissler, Olds & Lowe, P.C.

(57) ABSTRACT

A wafer assembly with alignment marks, a method for forming the wafer assembly and a wafer alignment method are disclosed. The alignment marks are disposed in bonding layers and dielectric layers on first and second wafers. Light reflected by a first dot mark and a first block mark on the first wafer, which are disposed in different layers, are superimposed with each other, ensuring clarity of patterns of these alignment marks. The first dot mark is disposed in a first bonding layer in such a manner that a top surface of the first dot mark is flush with a top surface of the first bonding layer. The first dot mark located on the bonding surface ensures that the bonding surface is macroscopically flat and does not leave any gap after bonding. Moreover, the first dot mark located on the bonding surface also avoids overlay errors between different layers. The same is applied to the second wafer.

20 Claims, 10 Drawing Sheets

(56) References Cited

U.S. PATENT DOCUMENTS

| | | | | |
|---|---|---|---|---|
| 2017/0034919 | A1* | 2/2017 | Fournel | H05K 3/30 |
| 2019/0355670 | A1 | 11/2019 | Chen et al. | |
| 2019/0385975 | A1* | 12/2019 | Wang | H01L 24/24 |
| 2019/0393067 | A1* | 12/2019 | Wang | H01L 21/67092 |
| 2020/0159133 | A1* | 5/2020 | Yan | H01L 23/544 |
| 2021/0368120 | A1* | 11/2021 | Shimotsusa | H10F 39/811 |
| 2022/0068829 | A1* | 3/2022 | Park | H01L 23/544 |

FOREIGN PATENT DOCUMENTS

| | | | |
|---|---|---|---|
| CN | 109904105 | A | 6/2019 |
| CN | 110634728 | A | 12/2019 |
| CN | 110854052 | A | 2/2020 |
| CN | 110854053 | A | 2/2020 |
| JP | 6574410 | | 9/2019 |

\* cited by examiner

WAFER ASSEMBLY HAVING ALIGNMENT MARKS, METHOD FOR FORMING SAME, AND WAFER ALIGNMENT METHOD

TECHNICAL FIELD

The present invention pertains to the field of integrated circuit fabrication technology, and relates in particular to a wafer assembly with alignment marks and a method for forming such a wafer assembly.

BACKGROUND

With the development of semiconductor very large scale integrated (VLSI) circuits, three-dimensional (3D) packaging technology has been developed to stack wafers by bonding techniques to achieve 3D metal interconnects, thereby shortening interconnection distances, speeding up transmission and producing more compact devices.

As a critical part of 3D stacking, wafer bonding includes hybrid bonding involving metal-to-metal bonding and dielectric-to-dielectric bonding, which can provide both metal interconnects and sufficient mechanical support.

Before wafers are vertically bonded together by hybrid bonding, they have to be vertically aligned. However, existing alignment solutions are suboptimal and associated with a number of problems such as reflection from metal features in alignment marks, which creates difficulties for a bonding machine to recognize the marks, overlay errors, steps between the metal features in the alignment marks and bonding layers, which lead to gaps after bonding.

SUMMARY OF THE INVENTION

It is an object of the present invention to provide a wafer assembly with alignment marks, a method for forming such a wafer assembly and a wafer alignment method. The alignment marks can be more easily recognized, avoid overlay errors between different layers and enable capturing of clear patterns and prevention of gaps left after bonding.

The present invention provides a wafer assembly with alignment marks, which includes:
- a first wafer, including: a first substrate; a first dielectric layer located on the first substrate; a first block mark embedded in the first dielectric layer; a first bonding layer located on the first dielectric layer; and a first dot mark embedded in the first bonding layer, wherein the first dot mark has a top surface flush with a top surface of the first bonding layer; and
- a second wafer, including: a second substrate; a second dielectric layer located on the second substrate; a second block mark embedded in the second dielectric layer; a second bonding layer located on the second dielectric layer; and a second dot mark embedded in the second bonding layer, wherein the second dot mark has a top surface flush with a top surface of the second bonding layer,
- wherein: an outer contour line of a projection of the first dot mark on the first substrate encompasses a projection of the first block mark on the first substrate; and an outer contour line of a projection of the second dot mark on the second substrate encompasses a projection of the second block mark on the second substrate;
- wherein the first block mark is matched with the second block mark; and
- wherein the first dot mark is matched with the second dot mark.

Additionally, when the first dot mark and the first block mark are projected onto a same plane, a minimum perpendicular distance from an outer contour line of the projection of the first dot mark to an outer contour line of the projection of the first block mark may be greater than an overlay error.

Additionally, the first dot mark may consist of an array of discrete dots that are substantially equally sized and are spaced apart by a substantially equal distance, wherein the array of discrete dots is formed by filling a metal into holes corresponding to the discrete dots, wherein compared with the first dot mark, the first block mark has at least a large continuous area.

Additionally, the first dot mark may include a plurality of rectangular solid blocks arranged into an array, wherein the first block mark is a rectangular solid block, a cross-shaped solid block, a triangular solid block or a mesh with through openings extending in a direction perpendicular to the first substrate.

Additionally, a shape of an outer contour line of the first dot mark may be as same as a shape of an outer contour line of the first block mark, wherein a predetermined distance is provided from the outer contour line of the first block mark to the outer contour line of the first dot mark, and wherein the predetermined distance is greater than an overlay error.

Additionally, a shape of the outer contour line of the first dot mark that is a rectangle may differ from a shape of the outer contour line of the first block mark that is a quasi-rectangle.

Additionally, a shape of the outer contour line of the first dot mark may be as same as a shape of an outer contour line of the second dot mark.

Additionally, a shape of the outer contour line of the first block mark may be as same as a shape of an outer contour line of the second block mark.

Additionally, a shape of the outer contour line of the first dot mark may be different from a shape of the outer contour line of the second dot mark.

Additionally, each of a shape of the outer contour lines of the first dot mark and a shape of the first block mark may be a cross, wherein each of a shape of the outer contour line of the second dot mark and a shape of the outer contour line of the second block mark consists of four triangles that are symmetrically arranged with respect to a center point and is obtained by rotating one triangle in clockwise or counter-clockwise about a center point by 90°, 180° and 270°.

Additionally, a first metal layer may be disposed in the first dielectric layer, wherein: the first block mark is made of a metal; the first block mark and the first metal layer are formed from a single metal layer in a same process; a second metal layer is disposed in the second dielectric layer; the second block mark is made of a metal; and the second block mark and the second metal layer are formed from a single metal layer in a same process.

Additionally, a first interconnect layer may be disposed in the first bonding layer, wherein: each of the first interconnect layer and the first dot mark is made of a metal; the first dot mark and the first interconnect layer are formed from a single metal layer in a same process; a second interconnect layer is disposed in the second bonding layer; each of the second interconnect layer and the second dot mark is made of a metal; and the second dot mark and the second interconnect layer are formed from a single metal layer in a same process.

The present invention also provides a method for forming a wafer assembly with alignment marks, which includes:
- providing a first wafer, including a first substrate and a first dielectric layer located on the first substrate; forming a first block mark in the first dielectric layer; forming a first bonding layer covering each of the first dielectric layer and the first block mark, and forming a first dot mark in the first bonding layer, wherein the first dot mark has a top surface flush with a top surface of the first bonding layer; and providing a second wafer, including a second substrate and a second dielectric layer located on the second substrate; forming a second block mark in the second dielectric layer; forming a second bonding layer covering each of the second dielectric layer and the second block mark; and forming a second dot mark in the second bonding layer, wherein the second dot mark has a top surface flush with a top surface of the second bonding layer, wherein: an outer contour line of a projection of the first dot mark on the first substrate encompasses a projection of the first block mark on the first substrate, and an outer contour line of a projection of the second dot mark on the second substrate encompasses a projection of the second block mark on the second substrate;

wherein the first block mark is matched with the second block mark; and wherein the first dot mark is matched with the second dot mark.

The present invention also provides a wafer alignment method, which includes:

providing the first and second wafers as defined above;

irradiating light onto the first wafer and acquiring patterns of alignment marks on the first wafer through the light reflected by the first dot mark and the first block mark;

irradiating light onto the second wafer and acquiring patterns of alignment marks on the second wafer through the light reflected by the second dot mark and the second block mark; and controlling the first wafer and/or the second wafer to move based on the patterns of the alignment marks on the first wafer and on the patterns of the alignment marks on the second wafer, thereby achieving an alignment of the first and second wafers.

Compared with the prior art, the present invention offers the following benefits:

The present invention provides a wafer assembly with alignment marks, a method for forming the wafer assembly alignment marks, and a wafer alignment method, which are suitable for use in hybrid bonding. The alignment marks are disposed in bonding layers and dielectric layers on first and second wafers. Light reflected from a first dot mark and a first block mark on the first wafer, which are disposed in different layers, are superimposed with each other, ensuring clarity of patterns of these alignment marks. The first dot mark is disposed in a first bonding layer in such a manner that a top surface of the first dot mark is flush with a top surface of the first bonding layer. The first dot mark on the bonding surface ensures that the bonding surface is macroscopically flat and does not leave any gap after bonding. Moreover, the first dot mark on the bonding surface also avoids overlay errors between different layers. The same is applied to the second wafer. Thus, with the alignment marks, a bonding machine is able to eliminate overlay errors between different layers and more clearly capture the patterns while preventing the problem of gaps between bonding surfaces. Without compromising bonding quality, the alignment marks of the present invention can not only provide effectively increased bonding accuracy, but also can enhance the recognizing ability of the bonding machine, thus ensuring process stability.

DESCRIPTION OF REFERENCE NUMERALS IN DRAWINGS

10: First Wafer; 101: First Substrate; 102: First Dielectric Layer; 103: First Bonding Layer; First Block Mark: 104a, 104b, 104c, 104d, 104e, 104f; First Dot Mark: 105a, 105b, 105c, 105d, 105e, 105f; 106: First Metal Layer; 107: First Interconnect Layer;

20: Second Wafer; 201: Second Substrate; 202: Second Dielectric Layer; 203: Second Bonding Layer; Second Block Mark: 204a, 204b, 204c, 204d; Second Dot Mark: 205a, 205b, 205c, 205d; 206: Second Metal Layer; 207—Second Interconnect Layer.

DETAILED DESCRIPTION

Embodiments of the present invention provide a wafer assembly with alignment marks, a method for forming such a wafer assembly and a method for aligning wafers. The present invention will be described in greater detail below with reference to particular embodiments and the accompanying drawings. Advantages and features of the present invention will become more apparent from the following description. Note that the figures are provided in a very simplified form not necessarily drawn to exact scale and for the only purpose of facilitating easy and clear description of the embodiments.

In an embodiment of the present invention, there is provided a wafer assembly with alignment marks, which includes:

a first wafer including a first substrate, a first dielectric layer located on the first substrate, a first block mark embedded in the first dielectric layer, a first bonding layer located on the first dielectric layer and a first dot mark embedded in the first bonding layer, wherein a top surface of the first dot mark is flush with a top surface of the first bonding layer; and a second wafer including a second substrate, a second dielectric layer located on the second substrate, a second block mark embedded in the second dielectric layer, a second bonding layer located on the second dielectric layer and a second dot mark embedded in the second bonding layer, wherein a top surface of the second dot mark is flush with a top surface of the second bonding layer, wherein:

an outer contour line of a projection of the first dot mark on the first substrate encompasses a projection of the first block mark on the first substrate, and an outer contour line of a projection of the second dot mark on the second substrate encompasses a projection of the second block mark on the second substrate;

the first block mark is matched with the second block mark; and the first dot mark is matched with the second dot mark.

Figure 1:
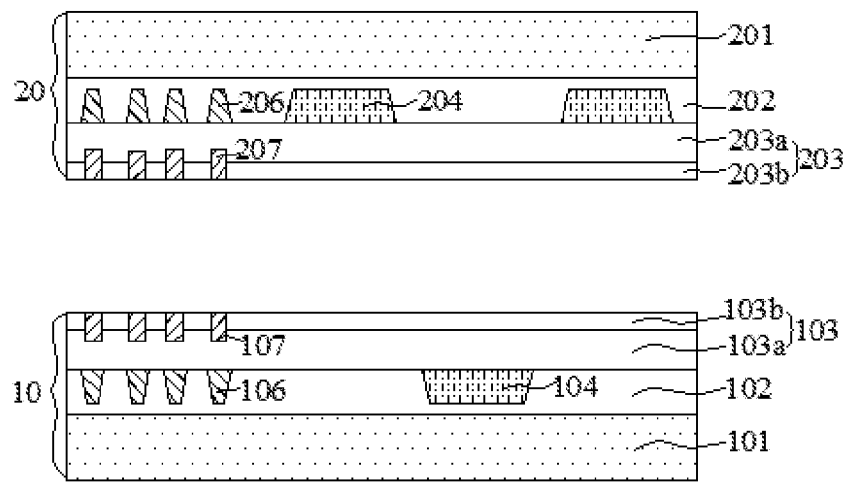
FIG. 1 is a schematic diagram of a wafer assembly with an alignment mark arrangement.

During the development of this wafer assembly with alignment marks, the inventors have found that, when the first wafer 10 has only the first block mark 104 that is located in the first dielectric layer 102 and is at the same layer as a first metal layer 106, and when the second wafer 20 has only the second block mark 204 that is located in the second dielectric layer 202 and is at the same layer as a second metal layer 206, as shown in FIG. 1, a bonding machine can accurately bond the first wafer 10 to the second wafer 20 vertically by recognizing the alignment marks on them and thereby positionally adjusting them with respect to each other. However, with the alignment mark arrangement shown in FIG. 1, light from the bonding machine must travel through the first bonding layer 103 before it can reach the first block mark 104. This creates difficulties for the bonding machine to recognize the mark. Moreover, non-flatness of the top surface of the first block mark 104 will add further difficulties in the recognition by the bonding machine. Further, accurate alignment between the first block mark 104 and the second block mark 204 does not necessarily mean accurate alignment between the surfaces of the first and second bonding layers 103, 203. Since the first block mark 104 and the first bonding layer 103 are located in different layers, and the second block mark 204 and the second bonding layer 203 are located in different layers, overlay errors between the layer where the first block mark 104 is located and the first bonding layer 103, and between the layer where the second block mark 204 is located and the second bonding layer 203 are introduced.

Figure 2:
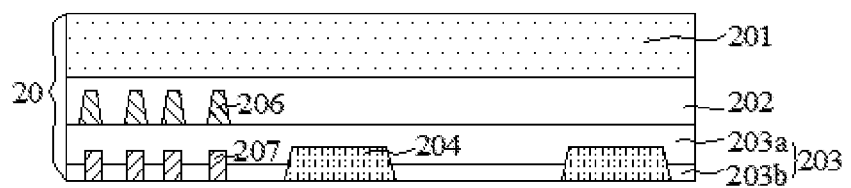
FIG. 2 is a schematic diagram of a wafer assembly with another alignment mark arrangement.
Figure 2:
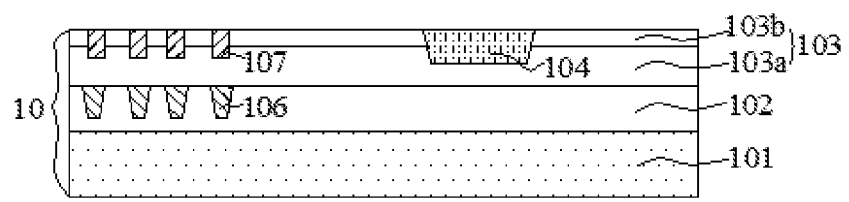

In order to overcome these problems associated with the arrangement of FIG. 1, the block marks may be instead arranged in the bonding layers. As shown in FIG. 2, the first wafer 10 has only the first block mark 104 that is located in the first bonding layer 103, and the second wafer 20 has only the second block mark 204 that is located in the second bonding layer 203. With this arrangement, the bonding machine can accurately align and bond the first wafer 10 to the second wafer 20 vertically by recognizing the alignment marks on them and thereby positionally adjusting them with respect to each other. This alignment mark arrangement shown in FIG. 2 circumvents the problem of overlay errors between the layers where the alignment marks are located and the bonding layers that the arrangement of FIG. 1 suffers from. Although the alignment mark arrangement of FIG. 2 provides clear mark patterns that can be easily recognized, it is problematic in that, when processed by chemical mechanical polishing (CMP), due to different polishing rates of the used CMP slurry for the block marks in the bonding layers and the bonding layers, the block marks will protrude beyond the bonding layers after the processing. That is, there will be height differences, and hence steps, between the block marks and the bonding layers. Such non-flatness in microscopic morphology will lead to gaps between the bonding surfaces.

Figure 3:
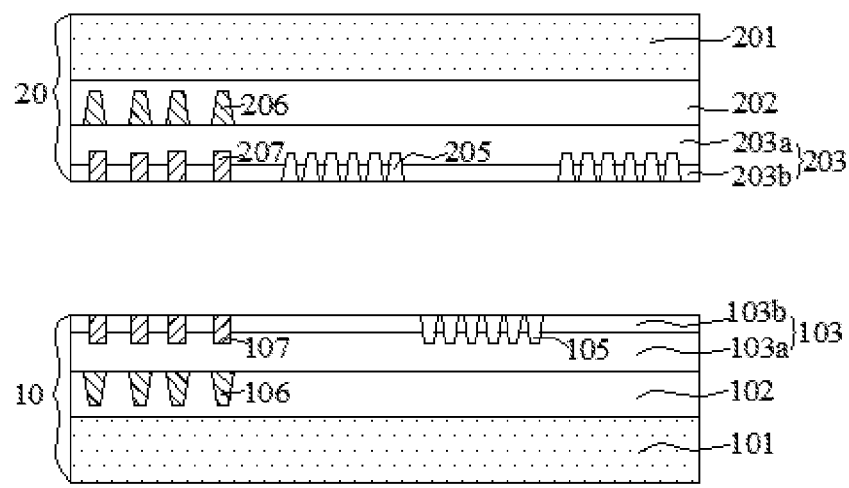
FIG. 3 is a schematic diagram of a wafer assembly with yet another alignment mark arrangement.

In order to overcome the problem of gaps formed between the bonding surfaces due to non-flatness caused by the presence of steps associated with the arrangement of FIG. 2, the block marks may be replaced with the dot marks. As shown in FIG. 3, the first wafer 10 has only the first dot mark 105 that is located in the first bonding layer 103, and the second wafer 20 has only the second dot mark 205 that is located in the second bonding layer 203. With the arrangement of FIG. 3, there will be no significant height differences or steps between the dot marks and the bonding layers after CMP, avoiding the formation of gaps between the bonding surfaces due to non-flatness. However, the dot alignment marks in the arrangement of FIG. 3 are problematic in that they cannot be clearly and easily recognized.

Figure 4:
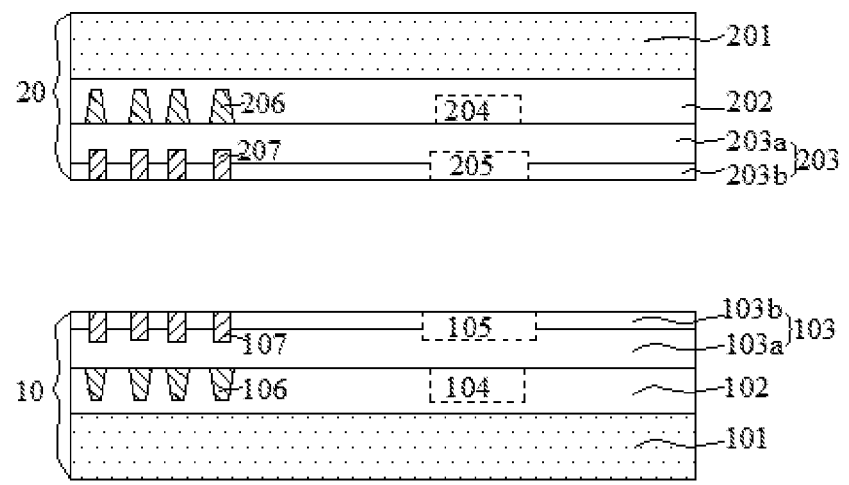
FIG. 4 is a schematic cross-sectional view of a wafer assembly with alignment marks according to embodiments of the present invention.

The wafer assembly with alignment marks according to this embodiment is developed on the basis of intensive study of the alignment mark arrangements shown in FIGS. 1 to 3. As shown in FIG. 4, a wafer assembly with a first alignment mark arrangement according to an embodiment of the present invention includes:

a first wafer 10 including a first substrate 101, a first dielectric layer 102 located on the first substrate 101, a first block mark 104 embedded in the first dielectric layer 102, a first bonding layer 103 located on the first dielectric layer 102 and a first dot mark 105 embedded in the first bonding layer 103, wherein a top surface of the first dot mark 105 is flush with a top surface of the first bonding layer 103; and a second wafer 20 including a second substrate 201, a second dielectric layer 202 located on the second substrate 201, a second block mark 204 embedded in the second dielectric layer 202, a second bonding layer 203 located on the second dielectric layer 202 and a second dot mark 205 embedded in the second bonding layer 203, wherein a top surface of the second dot mark 205 is flush with a top surface of the second bonding layer 203, wherein:

an outer contour line of a projection of the first dot mark 105 on the first substrate 101 (i.e., a line formed by interconnecting outermost edges of projections of outermost dots in the first dot mark 105 on the first substrate 101) encompasses a projection of the first block mark 104 on the first substrate 101, and an outer contour line of a projection of the second dot mark 205 on the second substrate 201 (i.e., a line formed by interconnecting outermost edges of projections of outermost dots in the second dot mark 205 on the second substrate 201) encompasses a projection of the second block mark 204 on the second substrate 201;

the first block mark 104 is matched with the second block mark 204; and the first dot mark 105 is matched with the second dot mark 205.

It is to be noted that, in FIG. 4, all the first dot mark 105, the first block mark 104, the second dot mark 205 and the second dot mark 205 are indicated by dashed boxes. This only indicates that there are these four types of marks in the respective layers, rather than that the four types of marks are shaped and relatively positioned as shown. The specific shapes and relative positions of the four types of marks are best shown in the corresponding top views. By "the first block mark 104 is matched with the second block mark 204", it is intended to mean that a bonding machine can positionally adjust the first wafer 10 and the second wafer 20 with respect to each other by recognizing the first block mark 104 and the second block mark 204. By "the first dot mark 105 is matched with the second dot mark 205", it is intended to mean that the bonding machine can positionally adjust the first wafer 10 and the second wafer 20 with respect to each other by recognizing the first dot mark 105 and the second dot mark 205.

In particular, a first metal layer 106 may be disposed in the first dielectric layer 102. The first block mark 104 may be formed of a metal such as aluminum, copper, tungsten or the like. The first block mark 104 and the first metal layer 106 may be formed from a single metal layer in the same process. A second metal layer 206 may be disposed in the second dielectric layer 202. The second block mark 204 may be formed of a metal such as aluminum, copper, tungsten or the like. The second block mark 204 and the second metal layer 206 may be formed from a single metal layer in the same process.

The bonding machine may recognize the alignment marks in the first wafer 10 by following: the light emanated from the bonding machine is reflected by the first dot mark 105 and the first block mark 104 in the two different layers, then the reflected lights are superimposed to ensure identification of clear patterns. Since the top surface of the first dot mark 105 is flush with the top surface of the first bonding layer 103 where the first dot mark 105 is located, it is ensured that the top surface of the first bonding layer 103 is macroscopically flat, without leaving any gap after bonding. Moreover, the problem of overlay errors between the bonding and dielectric layers associated with the arrangement of FIG. 1 in which there are no marks in the bonding layers and all the marks are arranged in the dielectric layers can be avoided. When the first dot mark and the first block mark are projected onto the same plane, a minimum perpendicular distance between outer contour lines of the projections of the first dot mark and the first block mark is greater than an overlay error, thus enabling identification of the outer contour lines of the first dot and block marks.

The outer contour line of the first dot mark can be considered to be a line formed by interconnecting outermost edges of (outermost dots in) the first dot mark. Alternatively, the first dot mark can be considered as a whole. In this case, the outer contour line may be simply an outer contour line of the whole.

The first dot mark may consist of an array of discrete dots. The dot array may be formed by filling a metal into holes, which are spaced part from one another and arranged into an array. The dots in the array may be substantially equally sized and spaced apart by substantially equal distances. In comparison with the first dot mark, the first block mark has at least a relatively large continuous area. The dot array of the first dot mark may consist of subsets of dots, which may each have an outer contour of an arbitrary shape and may be arranged according to certain rules to make up the first dot mark. The present invention is not limited to any particular shape of the dots, and these dots may have any shape, such as any one of rectangular, triangular and irregular shapes.

In particular, the first dot mark may include an array of rectangular dots, and the first block mark may be a rectangular solid block optionally with an array of through openings (mesh) extending in a direction perpendicular to the first substrate, a cross-shaped solid block, or a triangular solid block.

The outer contour line of the first dot mark may be of the same shape as the outer contour line of the first block mark (see FIGS. 5a to 5d and FIGS. 6a to 6c). A predetermined distance is provided from the outer contour line of the first dot mark to the outer contour line of the first block mark. The predetermined distance may be greater than an overlay error.

Figure 5A:
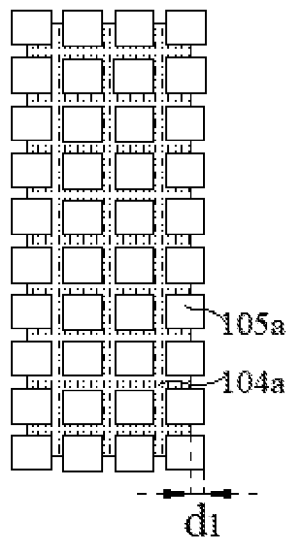
FIGS. 5a to 5d are schematic diagrams showing a wafer assembly with a first alignment mark arrangement.
Figure 5B:
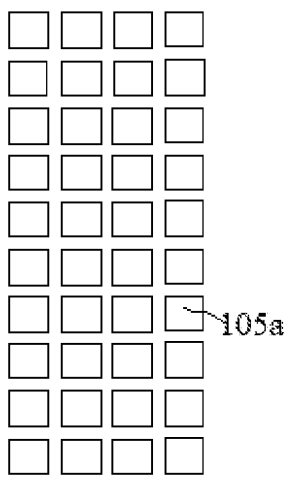
Figure 5C:
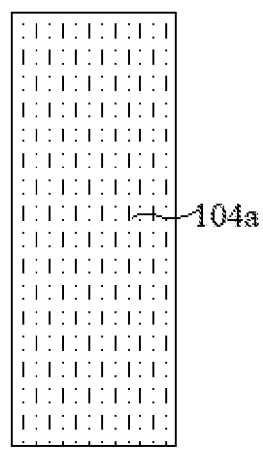
Figure 5D:
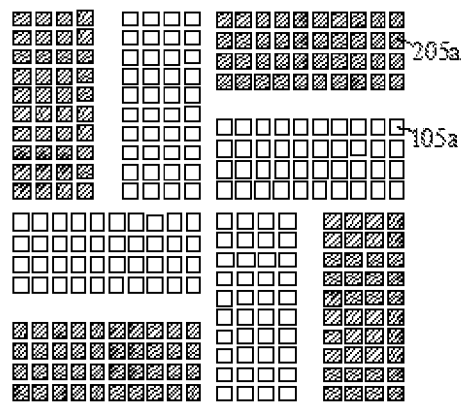

As shown in FIGS. 4 and 5a to 5d, the first dot mark 105a may include an array of rectangular dots (see FIG. 5b), and the first block mark 104a may be a rectangular solid block (see FIG. 5c). FIG. 5a shows a top view of both the first dot mark 105a and the first block mark 104a. The outer contour lines of the first dot mark 105a and the first block mark 104a may be both rectangular. A predetermined distance $d_1$ is provided from the outer contour line of the first block mark 104a to the outer contour line of the first dot mark 105a (here, in both first and second directions, more precisely, the horizontal and vertical directions, or X and Y directions, in FIG. 5a). The predetermined distance $d_1$ may be greater than an overlay error, in order to enable identification of the outer contour lines of the first dot mark 105a and the first block mark 104a. The outer contour line of the projection of the first dot mark 105a on the first substrate 101 encompasses the projection of the first block mark 104a on the first substrate 101, and the outer contour line of the projection of the second dot mark 205a on the second substrate 201 encompasses the projection of the second block mark on the second substrate 201. As an example, the second block mark and the second dot mark 205a may be structured and shaped in the same way as, but sized differently from, the first block mark 104a and the first dot mark 105a, respectively. FIG. 5d shows a top view of both the second dot mark 205a and the first dot mark 105a. As an example, both the second dot mark 205a and the first dot mark 105a may consist of subarrays of dots each having a rectangular outer contour shape. The dot mark may have a windmill shape formed by rotating one subarray of dots about a center point by 90°, 180° and 270° in clockwise or counterclockwise. In order to facilitate alignment, a geometric center of a pattern of the second dot mark 205a may coincide with a geometric center of a pattern of the first dot mark 105a. Likewise, a predetermined distance is provided from the outer contour line of the second block mark to the outer contour line of the second dot mark (here, in both first and second directions, e.g., the horizontal and vertical directions, or X and Y directions, in FIG. 6b; the predetermined distance in the X direction may be equal to the predetermined distance in the Y direction or not), and the predetermined distance may be greater than an overlay error. Through arranging the block and dot marks in the respective dielectric and bonding layers of the upper and lower wafers (i.e., the first wafer 10 and the second wafer 20) in such a manner that the marks are disposed in the respective different layers along the direction of thickness of the wafers and that the patterns of the dot marks in the bonding layers are similar to and slightly greater than patterns of the block marks in the dielectric layers, it is ensured that the patterns of the larger dot marks on the bonding surfaces are feature patterns to be recognized by the bonding machine and that overlay errors between different layers are eliminated.

Figure 6A:
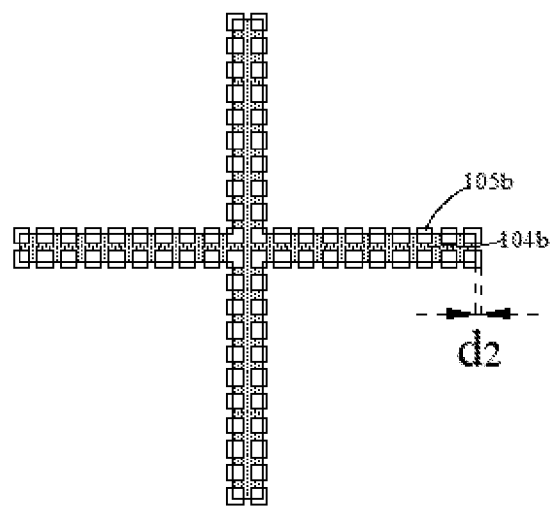
FIGS. 6a to 6c are schematic diagrams showing a wafer assembly with a second alignment mark arrangement.
Figure 6B:
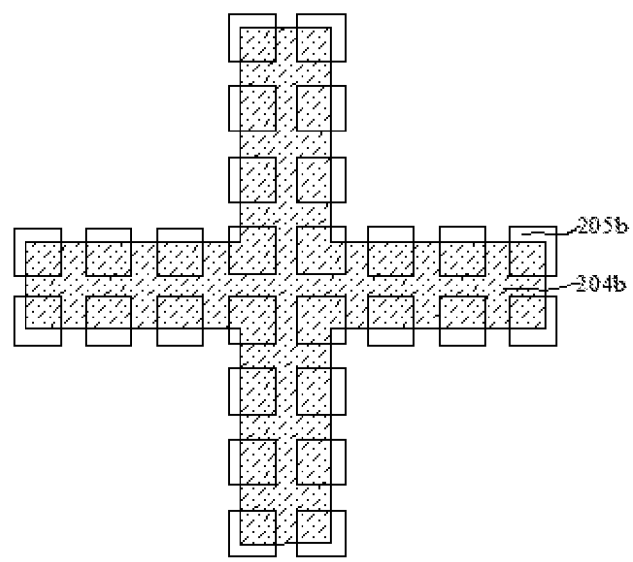
Figure 6C:
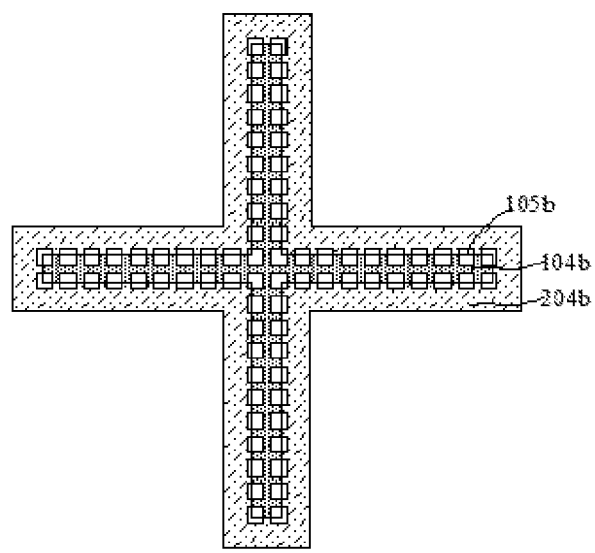

Reference is now made to FIGS. 4 and 6a to 6c. FIG. 6a shows a top view of both the first dot mark 105b and the first block mark 104b. FIG. 6b shows a top view of both the second dot mark 205b and the second block mark 204b. FIG. 6c shows a top view of all the second block mark 204b, the first dot mark 105b and the first block mark 104b. In order to facilitate alignment, a geometric center of a pattern of the second block mark 204b may coincide with a geometric center of a pattern of the first block mark 104b. The outer contour lines of the first dot mark 105b and the first block mark 104b may have the same cross-like shape. A predetermined distance $d_2$ is provided from the outer contour line of the first block mark 104b to the outer contour line of the first dot mark 105b. The predetermined distance $d_2$ may be greater than an overlay error, in order to enable identification of the outer contour lines of the first dot mark 105*b* and the first block mark 104*b*.

Figure 7A:
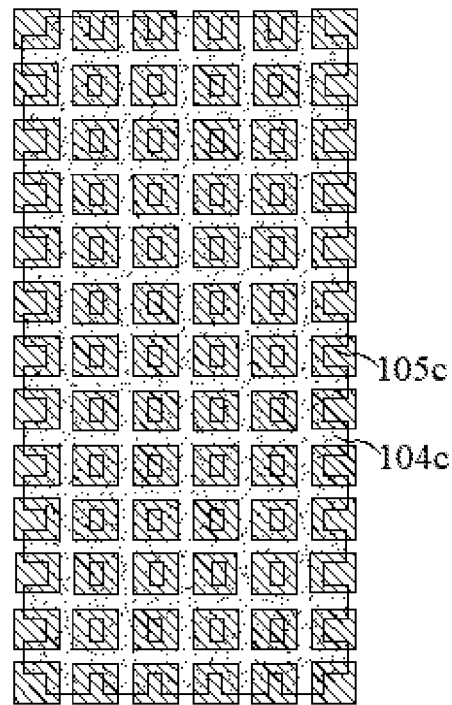
FIGS. 7a to 7c are schematic diagrams showing a wafer assembly with a third alignment mark arrangement.
Figure 7B:
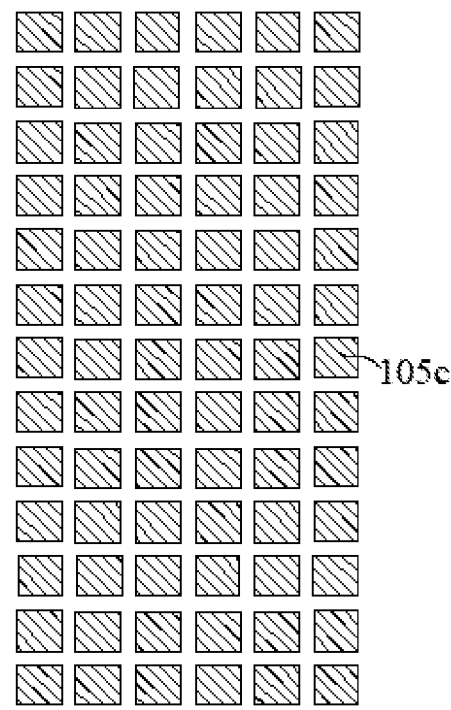
Figure 7C:
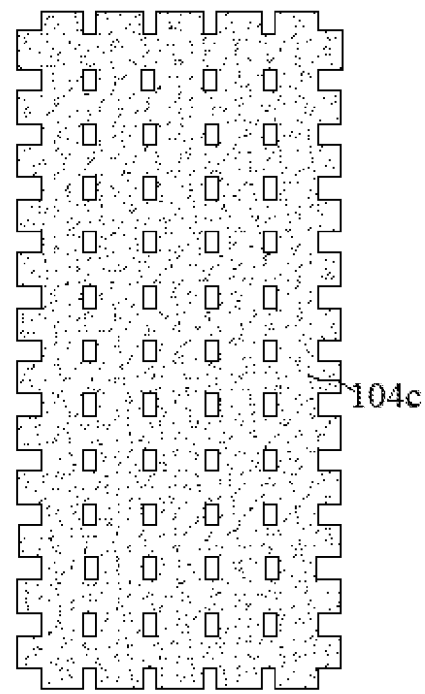

Alternatively, the outer contour lines of the first dot mark and the first block mark may have different shapes. In this case, the outer contour line of the first dot mark may be rectangular, while the outer contour line of the first block mark may be quasi-rectangular. Specifically, as shown in FIGS. 4 and 7*a* to 7*c*, the first dot mark 105*c* may include an array of rectangular dots (see FIG. 7*b*), while the first block mark 104*c* may have an array of through openings (in a mesh) extending in the direction perpendicular to the first substrate 101 (see FIG. 7*c*). The outer contour line of the first block mark 104*c* may be a quasi-rectangle, for example, the first block mark 104*c* generally appears like a rectangle but has an outer peripheral edge, which is a closed line with convex and concave segments. FIG. 7*a* shows a top view of both the first dot mark 105*c* and the first block mark 104*c*. According to embodiments of the present invention, the first block mark 104*c* may have an array of through openings (in a grid shape) extending in the direction perpendicular to the substrate. In this way, the problem of easy formation of depressions during CMP in case of the block mark being a completely solid piece (without through openings) having a large area, which may lead to non-flat microscopic morphology and hence gaps between the bonding surfaces, can be circumvented.

The outer contour lines of the first and second dot marks may be identically shaped (see FIGS. 5*d* and 6*a* to 6*b*). In this case, the outer contour lines of the first and second block marks may also be identically shaped (see FIGS. 6*a* and 6*b*).

Figure 8A:
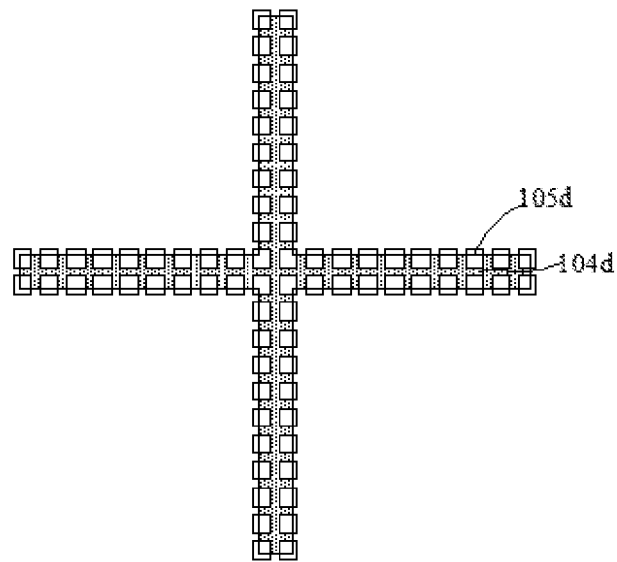
FIGS. 8a to 8c are schematic diagrams showing a wafer assembly with a fourth alignment mark arrangement.
Figure 8B:
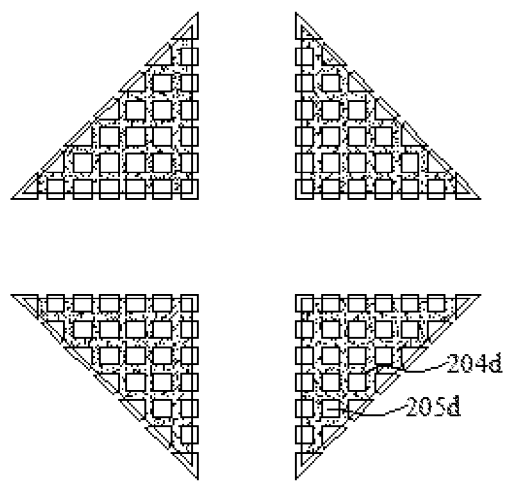
Figure 8C:
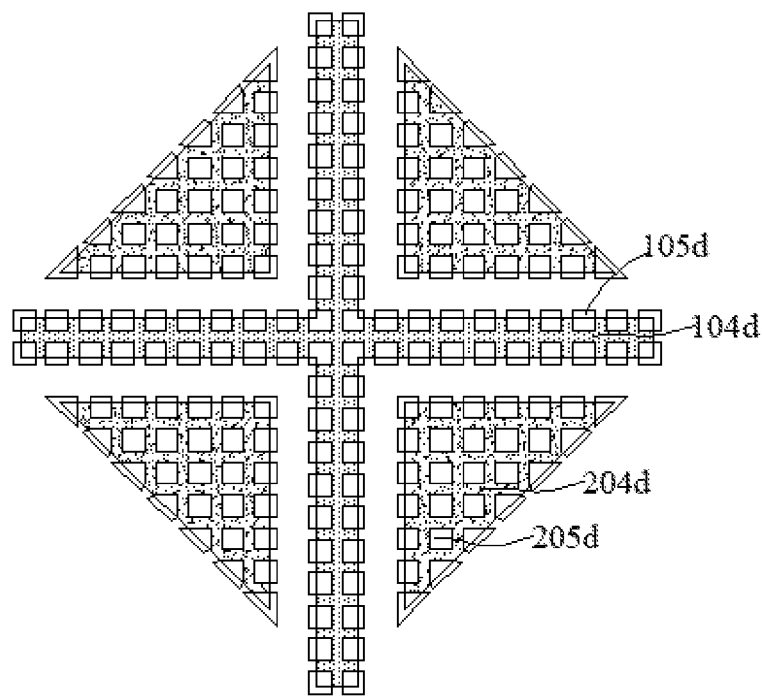

Alternatively, the outer contour lines of the first and second dot marks may be differently shaped (see FIG. 8*c*). In particular, reference can be made to FIGS. 4 and 8*a* to 8*c*. FIG. 8*a* shows a top view of both the first dot mark 105*d* and the first block mark 104*d*. FIG. 8*b* shows a top view of both the second dot mark 205*d* and the second block mark 204*d*. FIG. 8*c* shows a top view of all the second dot mark 205*d*, the second block mark 204*d*, the first dot mark 105*d* and the first block mark 104*d*. In order to facilitate alignment, a geometric center of a pattern of the second block mark 204*d* may coincide with a geometric center of a pattern of the first block mark 104*d*, and a geometric center of a pattern of the second dot mark 205*d* may coincide with a geometric center of a pattern of the first dot mark 105*d*. The outer contour lines of the first dot mark 105*d* and the first block mark 104*d* may be both cross-shaped, while the second dot mark 205*d* may, as shown in FIG. 8*b*, be a dot mark formed by rotating one subarray of dots with a triangular outer contour shape about a center point by 90°, 180° and 270° in clockwise or counterclockwise. Additionally, the outer contour lines of the second dot mark 205*d* and the second block mark 204*d* may be identically shaped.

The outer contour lines of the first dot mark and the first block mark may be identically shaped (see FIGS. 5*a*, 6*a* and 8*a*).

Figure 9:
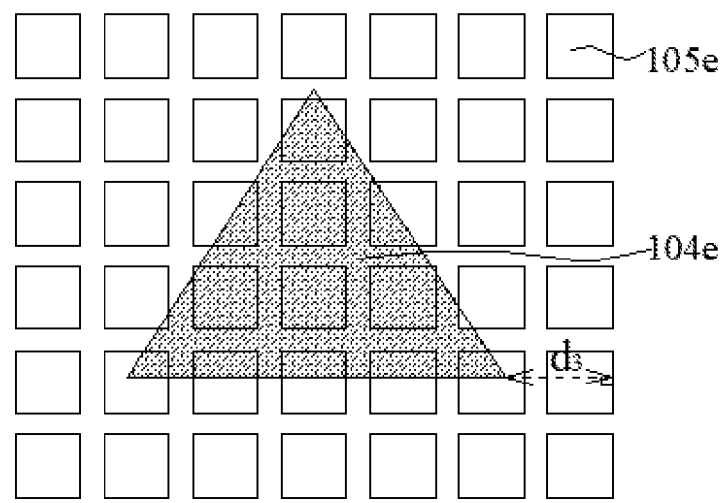
FIG. 9 is a schematic diagram showing a wafer assembly with a fifth alignment mark arrangement.
Figure 10:
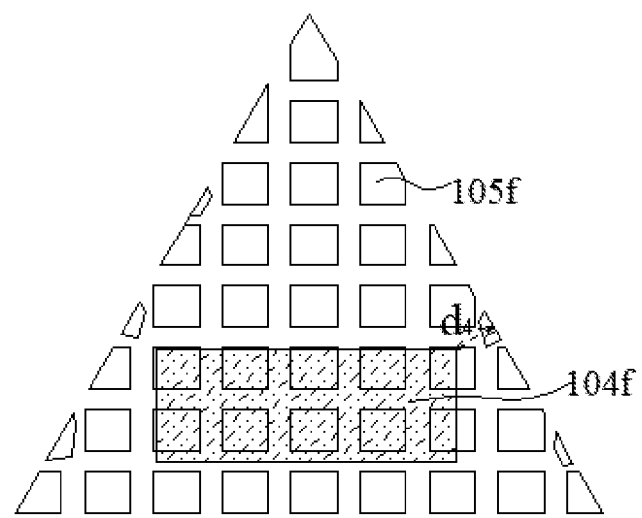
FIG. 10 is a schematic diagram showing a wafer assembly with a sixth alignment mark arrangement.

Alternatively, the outer contour lines of the first dot mark and the first block mark may be differently shaped (see FIGS. 7*a*, 9 and 10). As shown in FIG. 9, the outer contour line of the first dot mark 105*e* may be rectangular, while the outer contour line of the first block mark 104*e* may be triangular. The outer contour line of the projection of the first dot mark 105*e* on the first substrate encompasses the projection of the first block mark 104*e* on the first substrate. When the first dot mark 105*e* and the first block mark 104*e* are projected onto the same plane, a minimum perpendicular distance $d_3$ between outer contour lines of the projections of the first dot mark 105*e* and the first block mark 104*e* is greater than an overlay error. That is, the minimum distance between the two outer contour lines is greater than an overlay error, in order to enable identification of the outer contour lines of the first dot mark 105*e* and the first block mark 104*e*. As shown in FIG. 10, the outer contour line of the first dot mark 105*f* may be triangular, while the outer contour line of the first block mark 104*f* may be rectangular. A minimum perpendicular distance $d_4$ from the outer contour line of the first dot mark 105*f* to the outer contour line of the first block mark 104*f* may be greater than an overlay error.

According to embodiments of the present invention, as shown in FIG. 4, a first interconnect layer 107 may be disposed in the first bonding layer 103. Both the first interconnect layer 107 and the first dot mark 105 may be formed of a metal such as aluminum, copper, tungsten or the like. The first block mark 105 and the first interconnect layer 107 may be formed from a single metal layer in the same process. A top surface of the first interconnect layer 107 may be flushed with the top surfaces of the first dot mark 105 and the first bonding layer 103. A second interconnect layer 207 may be disposed in the second bonding layer 203. Both the second interconnect layer 207 and the second dot mark 205 may be formed of a metal such as aluminum, copper, tungsten or the like. The second dot mark 205 and the second interconnect layer 207 may be formed from a single metal layer in the same process. A top surface of the second interconnect layer 207 may be flushed with the top surfaces of the second dot mark 205 and the second bonding layer 203. After the first wafer 10 and the second wafer 20 are aligned with each other, hybrid bonding involving metal-to-metal bonding (e.g., the first interconnect layer 107 to the second interconnect layer 207) and dielectric-to-dielectric bonding (e.g., the first bonding layer 103 to the second bonding layer 203) may be carried out. The first interconnect layer 107 is provided to pick up electrical signals from the first wafer 10. The first interconnect layer 107 may be, for example, electrically connected to the first metal layer 106. The second interconnect layer 207 is provided to pick up electrical signals from the second wafer 20. The second interconnect layer 207 may be, for example, electrically connected to the second metal layer 206. As a result of the bonding, the first interconnect layer 107 is brought into contact with the second interconnect layer 207, thus electrically connecting the two wafer to each other.

The first dielectric layer 103 may be formed of one or a combination of two or more of silicon oxide, silicon nitride, the organic dielectric material benzocyclobutene and the organic dielectric material polyimide. For example, the first dielectric layer 103 may include a silicon oxide layer 103*a* and a silicon nitride layer 103*b* located on the silicon oxide layer 103*a*. The second dielectric layer 203 may be formed of the same material as the first dielectric layer 103.

Each of the first substrate 101 and the second substrate 201 may be a semiconductor substrate made of any semiconductor material suitable for semiconductor devices (such as silicon, silicon carbide, silicon germanium, etc.) In other embodiments, each of the first substrate 101 and the second substrate 201 may also be any one of various composite substrates such as silicon-on-insulator (SOI) and silicon-germanium-on-insulator (SiGeOI) substrates. Those skilled in the art will appreciate that the invention is not limited to any type of substrate, and suitable choices can be made according to the requirements of actual applications. Various device components (not limited to those of semiconductor devices, not shown) may be formed in the substrates. Other layers or components, such as gate structures, contact holes, dielectric layers, metal bonding wires and vias, may have been already formed in the first and second substrates 101, 201.

The present invention also provides a method for forming a wafer assembly with alignment marks, which includes:

providing a first wafer including a first substrate and a first dielectric layer located on the first substrate, and forming a first block mark in the first dielectric layer, forming a first bonding layer covering each of the first dielectric layer and the first block mark, and forming a first dot mark in the first bonding layer, wherein a top surface of the first dot mark is flush with a top surface of the first bonding layer; and providing a second wafer including a second substrate and a second dielectric layer located on the second substrate, and forming a second block mark in the second dielectric layer, forming a second bonding layer covering each of the second dielectric layer and the second block mark, and forming a second dot mark in the second bonding layer, wherein a top surface of the second dot mark is flush with a top surface of the second bonding layer, wherein an outer contour line of a projection of the first dot mark on the first substrate encompasses a projection of the first block mark on the first substrate, and an outer contour line of a projection of the second dot mark on the second substrate encompasses a projection of the second block mark on the second substrate, wherein the first block mark is matched with the second block mark, and wherein the first dot mark is matched with the second dot mark.

The present invention also provides a wafer alignment method including:

providing the first and second wafers as defined above;

irradiating light onto the first wafer and acquiring patterns of alignment marks on the first wafer through the light reflected by the first dot mark and the first block mark;

irradiating light onto the second wafer and acquiring patterns of alignment marks on the second wafer through the light reflected by the second dot mark and the second block mark; and performing image processing on the patterns of the alignment marks on the first wafer and on the patterns of the alignment marks on the second wafer and moving the first wafer and/or the second wafer based on a result of the processing, thus achieving alignment of the first and second wafers.

In particular, the bonding machine may bond the first and second wafers together after they have been aligned with each other. The bonding machine may include optical devices for monitoring the alignment marks on the first wafer and/or the second wafer and detecting positions of the alignment marks. The bonding machine may include a light source, a camera and an optical lens in the camera. As shown in FIG. 4, the light source may irradiate light onto the first wafer, which may be then reflected by the first dot mark 105 and the first block mark 104 disposed in different layers to the optical lens in the bonding machine. The optical lens may acquire the patterns of the alignment marks on the first wafer from the reflections. The reflections from the first dot mark 105 and the first block mark 104 disposed in different layers may be superimposed with each other, in order to ensure clarity of the patterns of the alignment marks on the first wafer. The first wafer may be then moved away.

The bonding machine may irradiate light onto the second wafer 20, which may be then reflected by the second dot mark 205 and the second block mark 204 disposed in different layers to the optical lens in the bonding machine. The optical lens may acquire the patterns of the alignment marks on second wafer from the reflections. The reflections from the second dot mark 205 and the second block mark 204 disposed in different layers may be superimposed with each other, in order to ensure clarity of the patterns of the alignment marks on the second wafer.

Image processing may be performed on the patterns of the alignment marks on the first wafer and on the patterns of the alignment marks on the second wafer, and the first wafer and/or the second wafer may be moved based on a result of the processing, thereby achieving alignment of the first and second wafers. The wafers may be bonded together after they are aligned with each other. The image processing performed on the patterns of the alignment marks on the first wafer and on the patterns of the alignment marks on the second wafer may include, for example, combining the patterns of the alignment marks on the first wafer with the patterns of the alignment marks on the second wafer, as schematically illustrated in FIG. 8c. Based on this, the first wafer and/or the second wafer may be moved.

In summary, the present invention provides a wafer assembly with alignment marks, a method for forming the wafer assembly and a wafer alignment method, which are suitable for use in hybrid bonding. The alignment marks are disposed in bonding layers and dielectric layers on first and second wafers. Reflection of light from a first dot mark and a first block mark on the first wafer, which are disposed in different layers, are superimposed with each other, ensuring clarity of patterns of these alignment marks. The first dot mark is disposed in a first bonding layer in such a manner that a top surface of the first dot mark is flush with a top surface of the first bonding layer. The first dot mark on the bonding surface ensures that the bonding surface is macroscopically flat and does not leave any gap after bonding. Moreover, the first dot mark located on the bonding surface also avoids overlay errors between different layers. The same is applied to the second wafer. Thus, with the alignment marks, a bonding machine is able to eliminate overlay errors between different layers and more clearly capture the patterns while preventing the problem of gaps between bonding surfaces. Without compromising bonding quality, the alignment marks of the present invention can not only provide effectively increased bonding accuracy, but also can enhance the recognizing ability of the bonding machine, thus ensuring process stability.

The embodiments disclosed herein are described in a progressive manner, with the description of each embodiment focusing on its differences from others. Reference can be made between the embodiments for their identical or similar parts. Since the method embodiments correspond to the device embodiments, they are described relatively briefly, and reference can be made to the device embodiments for details of them.

The description presented above is merely that of some preferred embodiments of the present invention and is not intended to limit the scope thereof in any sense. Any and all changes and modifications made by those of ordinary skill in the art based on the above teachings fall within the scope as defined in the appended claims.

What is claimed is:

1. A wafer assembly with alignment marks, comprising:
a first wafer, comprising: a first substrate; a first dielectric layer located on the first substrate; a first block mark embedded in the first dielectric layer; a first bonding layer located on the first dielectric layer; and a first dot mark embedded in the first bonding layer, wherein the first dot mark has a top surface flush with a top surface of the first bonding layer; and a second wafer comprising: a second substrate; a second dielectric layer located on the second substrate; a second block mark embedded in the second dielectric layer; a second bonding layer located on the second dielectric layer; and a second dot mark embedded in the second bonding layer, wherein the second dot mark has a top surface flush with a top surface of the second bonding layer, wherein: an outer contour line of a projection of the first dot mark on the first substrate encompasses a projection of the first block mark on the first substrate, and an outer contour line of a projection of the second dot mark on the second substrate encompasses a projection of the second block mark on the second substrate;

wherein the first block mark is matched with the second block mark; and wherein the first dot mark is matched with the second dot mark.

2. The wafer assembly of claim 1, wherein when the first dot mark and the first block mark are projected onto a same plane, a minimum perpendicular distance from an outer contour line of the projection of the first dot mark to an outer contour line of the projection of the first block mark is greater than an overlay error.

3. The wafer assembly of claim 1, wherein the first dot mark consists of an array of discrete dots that are substantially equally sized and are spaced apart by a substantially equal distance, wherein the array of discrete dots is formed by filling a metal into holes corresponding to the discrete dots, and wherein compared with the first dot mark, the first block mark has at least a large continuous area.

4. The wafer assembly of claim 3, wherein the first dot mark comprises a plurality of rectangular solid blocks arranged into an array, and wherein the first block mark is a rectangular solid block, a cross-shaped solid block, a triangular solid block or a mesh with through openings extending in a direction perpendicular to the first substrate.

5. The wafer assembly of claim 4, wherein a shape of an outer contour line of the first dot mark is as same as a shape of an outer contour line of the first block mark, wherein a predetermined distance is provided from the outer contour line of the first block mark to the outer contour line of the first dot mark, and wherein the predetermined distance is greater than an overlay error.

6. The wafer assembly of claim 3, wherein a shape of an outer contour line of the first dot mark that is a rectangle differs from a shape of an outer contour line of the first block mark that is a quasi-rectangle.

7. The wafer assembly of claim 1, wherein a shape of an outer contour line of the first dot mark is as same as a shape of an outer contour line of the second dot mark.

8. The wafer assembly of claim 7, wherein a shape of an outer contour line of the first block mark is as same as a shape of an outer contour line of the second block mark.

9. The wafer assembly of claim 1, wherein a shape of an outer contour line of the first dot mark is different from a shape of an outer contour line of the second dot mark.

10. The wafer assembly of claim 9, wherein each of a shape of the outer contour line of the first dot mark and a shape of an outer contour line of the first block mark is a cross, wherein each of a shape of the outer contour line of the second dot mark and a shape of the outer contour line of the second block mark consists of four triangles that are symmetrically arranged with respect to a center point, and is obtained by rotating one triangle in clockwise or counterclockwise about a center point by 90°, 180° and 270°.

11. The wafer assembly of claim 1, wherein: a first metal layer is disposed in the first dielectric layer; the first block mark is made of a metal; the first block mark and the first metal layer are formed from a single metal layer in a same process; a second metal layer is disposed in the second dielectric layer; the second block mark is made of a metal; and the second block mark and the second metal layer are formed from a single metal layer in a same process.

12. The wafer assembly of claim 1, wherein: a first interconnect layer is disposed in the first bonding layer; each of the first interconnect layer and the first dot mark is made of a metal; the first dot mark and the first interconnect layer are formed from a single metal layer in a same process; a second interconnect layer is disposed in the second bonding layer; each of the second interconnect layer and the second dot mark is made of a metal; and the second dot mark and the second interconnect layer are formed from a single metal layer in a same process.

13. A method for forming a wafer assembly with alignment marks, comprising:
providing a first wafer, comprising a first substrate and a first dielectric layer located on the first substrate;
forming a first block mark in the first dielectric layer,
forming a first bonding layer covering each of the first dielectric layer and the first block mark;
forming a first dot mark in the first bonding layer, wherein the first dot mark has a top surface flush with a top surface of the first bonding layer; and
providing a second wafer, comprising a second substrate and a second dielectric layer on the second substrate;
forming a second block mark in the second dielectric layer,
forming a second bonding layer covering each of the second dielectric layer and the second block mark,
forming a second dot mark in the second bonding layer, wherein the second dot mark has a top surface flush with a top surface of the second bonding layer,
wherein: an outer contour line of a projection of the first dot mark on the first substrate encompasses a projection of the first block mark on the first substrate, and an outer contour line of a projection of the second dot mark on the second substrate encompasses a projection of the second block mark on the second substrate;
wherein the first block mark is matched with the second block mark; and
wherein the first dot mark is matched with the second dot mark.

14. A wafer alignment method, comprising:
providing a first wafer and a second wafer;
irradiating light onto the first wafer, and acquiring patterns of alignment marks on the first wafer through the light reflected by the first dot mark and the first block mark;
irradiating light onto the second wafer, and acquiring patterns of alignment marks on the second wafer through the light reflected by the second dot mark and the second block mark; and
controlling the first wafer and/or the second wafer to move based on the patterns of the alignment marks on the first wafer and on the patterns of the alignment marks on the second wafer, thereby achieving an alignment of the first and second wafers;

wherein the first wafer comprises: a first substrate; a first dielectric layer located on the first substrate; a first block mark embedded in the first dielectric layer; a first bonding layer located on the first dielectric layer; and a first dot mark embedded in the first bonding layer, wherein the first dot mark has a top surface flush with a top surface of the first bonding layer; and wherein the second wafer comprises: a second substrate; a second dielectric layer located on the second substrate; a second block mark embedded in the second dielectric layer; a second bonding layer located on the second dielectric layer; and a second dot mark embedded in the second bonding layer, wherein the second dot mark has a top surface flush with a top surface of the second bonding layer, wherein: an outer contour line of a projection of the first dot mark on the first substrate encompasses a projection of the first block mark on the first substrate, and an outer contour line of a projection of the second dot mark on the second substrate encompasses a projection of the second block mark on the second substrate;

wherein the first block mark is matched with the second block mark; and wherein the first dot mark is matched with the second dot mark.

15. The wafer alignment method of claim 14, wherein when the first dot mark and the first block mark are projected onto a same plane, a minimum perpendicular distance from an outer contour line of the projection of the first dot mark to an outer contour line of the projection of the first block mark is greater than an overlay error.

16. The wafer alignment method of claim 14, wherein the first dot mark consists of an array of discrete dots that are substantially equally sized and are spaced apart by a substantially equal distance, wherein the array of discrete dots is formed by filling a metal into holes corresponding to the discrete dots, and wherein compared with the first dot mark, the first block mark has at least a large continuous area.

17. The wafer alignment method of claim 16, wherein the first dot mark comprises a plurality of rectangular solid blocks arranged into an array, and wherein the first block mark is a rectangular solid block, a cross-shaped solid block, a triangular solid block or a mesh with through openings extending in a direction perpendicular to the first substrate.

18. The wafer alignment method of claim 17, wherein a shape of an outer contour line of the first dot mark is as same as a shape of an outer contour line of the first block mark, wherein a predetermined distance is provided from the outer contour line of the first block mark to the outer contour line of the first dot mark, and wherein the predetermined distance is greater than an overlay error.

19. The wafer alignment method of claim 16, wherein a shape of an outer contour line of the first dot mark that is a rectangle differs from a shape of an outer contour line of the first block mark that is a quasi-rectangle.

20. The wafer alignment method of claim 14, wherein a shape of an outer contour line of the first dot mark is as same as a shape of an outer contour line of the second dot mark.

* * * * *